US012810915B2

(12) United States Patent
Yin et al.

(10) Patent No.: US 12,810,915 B2
(45) Date of Patent: Nov. 24, 2026

(54) BIT LINE READING CIRCUIT, MEMORY, AND ELECTRONIC DEVICE

(71) Applicant: HUAWEI TECHNOLOGIES CO., LTD., Shenzhen (CN)

(72) Inventors: Shihui Yin, Shanghai (CN); Weiliang Jing, Shanghai (CN); Bingwu Ji, Shenzhen (CN); Sitong Bu, Shanghai (CN); Zhengbo Wang, Shenzhen (CN); Heng Liao, Shanghai (CN)

(73) Assignee: Huawei Technologies Co., LTD., Shenzhen (CN)

( * ) Notice: Subject to any disclaimer, the term of this patent is extended or adjusted under 35 U.S.C. 154(b) by 119 days.

(21) Appl. No.: 18/919,810

(22) Filed: Oct. 18, 2024

(65) Prior Publication Data

US 2025/0037749 A1 Jan. 30, 2025

Related U.S. Application Data

(63) Continuation of application No. PCT/CN2023/070713, filed on Jan. 5, 2023.

(30) Foreign Application Priority Data

Apr. 20, 2022 (CN) ......................... 202210417231.7

(51) Int. Cl.
*G11C 11/22* (2006.01)

(52) U.S. Cl.
CPC ........ *G11C 11/2273* (2013.01); *G11C 11/221* (2013.01); *G11C 11/2255* (2013.01)

(58) Field of Classification Search
CPC .............. G11C 11/2273; G11C 11/221; G11C 11/2255; G11C 11/404; G11C 2207/002;
(Continued)

(56) References Cited

U.S. PATENT DOCUMENTS 5,307,304 A * 4/1994 Saito ....................... G11C 11/22
257/E27.085
5,663,904 A * 9/1997 Arase ...................... G11C 11/22
365/210.1

(Continued)

FOREIGN PATENT DOCUMENTS

EP 1087405 A1 3/2001

OTHER PUBLICATIONS

Sung et al., "Low Voltage and High Speed 1Xnm 1T1C FE-RAM with Ultra-Thin 5nm HZO," Proceedings of 2021 IEEE International Electron Devices Meeting (IEDM), Dec. 11, 2021, 4 pages.

(Continued)

*Primary Examiner* — Michael T Tran
(74) *Attorney, Agent, or Firm* — Fish & Richardson P.C.

(57) ABSTRACT

This disclosure relates to a bit line reading circuit, a memory, and an electronic device. An example bit line reading circuit includes a bit line connected to a ferroelectric memory cell. The bit line reading circuit further includes a reference line, a sense amplifier, and a precharge circuit. The sense amplifier and the precharge circuit are separately connected to the bit line and the reference line. The bit line reading circuit further includes a first switch connected to the bit line between the sense amplifier and the precharge circuit, and a second switch connected to the reference line between the sense amplifier and the precharge circuit.

20 Claims, 8 Drawing Sheets

(58) Field of Classification Search
CPC . G11C 7/065; G11C 11/5657; G11C 11/4091; G11C 5/147; G11C 7/06; G11C 11/4097
USPC .................................................. 365/145, 158
See application file for complete search history.

(56) References Cited

U.S. PATENT DOCUMENTS

| | | | | |
|---|---|---|---|---|
| 9,761,312 | B1 * | 9/2017 | Kajigaya | G11C 11/2273 |
| 2003/0142534 | A1 * | 7/2003 | Takashima | G11C 11/4094 365/149 |
| 2009/0231903 | A1 * | 9/2009 | Ogiwara | G11C 29/50 365/207 |
| 2010/0054064 | A1 * | 3/2010 | Miyakawa | G11C 11/4099 365/207 |
| 2011/0035644 | A1 * | 2/2011 | Madan | G06F 11/1048 714/E11.03 |
| 2014/0146591 | A1 * | 5/2014 | Sun | G11C 29/50016 365/207 |

OTHER PUBLICATIONS

Extended European Search Report in European Appln. No. 23790831.4, mailed on May 27, 2025, 10 pages.

* cited by examiner

BIT LINE READING CIRCUIT, MEMORY, AND ELECTRONIC DEVICE

CROSS-REFERENCE TO RELATED APPLICATIONS

This application is a continuation of International Application No. PCT/CN2023/070713, filed on Jan. 5, 2023, which claims priority to Chinese Patent Application No. 202210417231.7, filed on Apr. 20, 2022. The disclosures of the aforementioned applications are hereby incorporated by reference in their entireties.

TECHNICAL FIELD

This disclosure relates to the field of circuit technologies, and in particular, to a bit line reading circuit, a memory, and an electronic device.

BACKGROUND

In an existing computing system, a dynamic random access memory (DRAM) may be used as a memory to temporarily store operation data of a central processing unit (CPU) and data exchanged with an external memory like a hard disk drive.

As size reduction of a 1T1C-based DRAM gradually encounters a bottleneck, a 1TnC-based ferroelectric random access memory (FeRAM) becomes an important option to further improve integration density of the DRAM. As shown in FIG. 1, in a 1TnC memory cell, ends of n ferroelectric capacitors C1 to Cn are respectively controlled by n plate lines PL1 to PLn, and the other ends of the n ferroelectric capacitors C1 to Cn are connected to a common node FN in the ferroelectric memory cell. The node FN is connected to a source of a field effect transistor (FET) TO, a drain of the field effect transistor T0 is connected to a common bit line (BL), and a gate of the field effect transistor T0 is connected to a word line (WL). Information of the ferroelectric capacitor may be read through amplifying, by a sense amplifier (SA), a voltage change caused by a charge change on the bit line BL. The charge change on the bit line BL is mainly caused by a polarization charge released when the non-volatile ferroelectric capacitor withstands a voltage exceeding coercive field strength.

Because the ends of the n ferroelectric capacitors C1 to Cn are connected to the common node FN, to distinguish a selected ferroelectric capacitor from unselected n−1 ferroelectric capacitors in the n ferroelectric capacitors C1 to Cn, the unselected ferroelectric capacitors withstand a "half-select" external voltage $V_w/2$ in a read/write process, that is, a half of a voltage $V_w$ withstood by the selected ferroelectric capacitor. Generally, the "half-select" voltage $V_w/2$ is less than a coercive field voltage $V_c$, and the unselected ferroelectric capacitors do not release significant polarization charges. To be compatible with a conventional double data rate (DDR) DRAM protocol, after a row of ferroelectric memory cells are activated and before a next precharge command, nodes FN in the selected ferroelectric memory cells are in a voltage state of 0 or $V_w$ for a long time because the nodes FN are connected to the sense amplifier, and unselected plate lines PL are in $V_w/2$. Therefore, the unselected ferroelectric capacitors (for example, C2 to Cn in FIG. 1) in the ferroelectric memory cell are in a "half-select" voltage state. However, if the ferroelectric capacitor is in the "half-select" voltage for a long time, internal spontaneous polarization intensity of the ferroelectric capacitor also obviously changes. This further affects a size of an information reading window. To improve a change of a polarization state of the ferroelectric capacitor due to interference of the "half-select" voltage for a long time, it is usually necessary to perform a periodic refresh operation on the ferroelectric capacitor. Therefore, how to shorten a time in which the ferroelectric capacitor is in the "half-select" voltage state is a technical problem that needs to be urgently resolved by a person skilled in the art.

SUMMARY

This disclosure provides a bit line reading circuit, a memory, and an electronic device, to improve a case in which a ferroelectric capacitor is in a "half-select" state for a long time in a read/write process of a 1TnC ferroelectric memory.

According to a first aspect, an embodiment of this disclosure provides a bit line reading circuit. The bit line reading circuit is configured to read a level from a ferroelectric memory cell. The bit line reading circuit may include a bit line, a reference line, a precharge circuit, a sense amplifier, a first switch, and a second switch. The bit line is connected to the ferroelectric memory cell. The ferroelectric memory cell generally includes n ferroelectric capacitors and one transistor, where n is an integer greater than or equal to 2. A gate of the transistor is connected to a word line, a first electrode of the transistor is connected to the bit line, a second electrode of the transistor is connected to one end of each of the n ferroelectric capacitors, and the other end of each ferroelectric capacitor is correspondingly connected to a plate line. The sense amplifier is separately connected to the bit line and the reference line, and is configured to perform differential amplification on voltages of the bit line and the reference line. The precharge circuit is separately connected to the bit line and the reference line, and is configured to precharge the bit line and the reference line. The first switch is connected to the bit line between the sense amplifier and the precharge circuit, and is configured to connect or disconnect the bit line between the sense amplifier and the precharge circuit. The second switch is connected to the reference line between the sense amplifier and the precharge circuit, and is configured to connect or disconnect the reference line between the sense amplifier and the precharge circuit. In this way, when the bit line reading circuit is in a read/write phase, the sense amplifier operates normally, the first switch disconnects the bit line between the sense amplifier and the precharge circuit, and the second switch disconnects the reference line between the sense amplifier and the precharge circuit. Therefore, a voltage of the bit line may be pulled by the precharge circuit to a voltage the same as a voltage of a plate line connected to an unselected ferroelectric capacitor in the ferroelectric memory cell. For example, if the voltage of the plate line connected to the unselected ferroelectric capacitor is $V_w/2$, a voltage of the bit line is pulled to $V_w/2$ by the precharge circuit. In this way, voltages at two ends of the unselected ferroelectric capacitor are the same, so that the unselected ferroelectric capacitor is not in a "half-select" state in the read/write phase. This shortens a time in which the ferroelectric capacitor is in the "half-select" state.

It should be noted that, in this disclosure, compared with the sense amplifier, the precharge circuit is closer to the ferroelectric memory cell in a connection location on the bit line, that is, information of the ferroelectric memory cell is first transmitted to the precharge circuit through the bit line, and then transmitted to the sense amplifier via the first switch. Correspondingly, a signal transmitted by the precharge circuit to the reference line needs to be transmitted to the sense amplifier via the second switch.

The following describes this disclosure in detail with reference to specific embodiments. It should be noted that embodiments are intended to better explain this disclosure, but are not intended to limit this disclosure.

For example, in the bit line reading circuit, the first switch may include a first transistor. A gate of the first transistor is connected to a first isolation control line, and a first electrode and a second electrode of the first transistor are connected to the bit line between the sense amplifier and the precharge circuit. When the first isolation control line controls the first switch to be turned on, an end that is of the bit line and that is close to the precharge circuit is connected to an end that is of the bit line and that is close to the sense amplifier, and a signal can be transmitted between the two ends. When the first isolation control line controls the first switch to be turned off, the end that is of the bit line and that is close to the precharge circuit is disconnected from the end that is of the bit line and that is close to the sense amplifier, a signal cannot be transmitted between the two ends, and the precharge circuit is isolated from the sense amplifier.

During specific implementation, the first transistor may be a P-type transistor, or may be an N-type transistor. This is not limited herein. When the first transistor is the P-type transistor, the first transistor is turned on when the first isolation control line is at a low level, and the first transistor is turned off when the first isolation control line is at a high level. When the first transistor is the N-type transistor, the first transistor is turned on when the first isolation control line is at a high level, and the first transistor is turned off when the first isolation control line is at a low level.

The foregoing is merely an example for describing a specific structure of the first switch. During specific implementation, the specific structure of the first switch is not limited to the foregoing structure provided in embodiments of this disclosure, or may be another structure known by a person skilled in the art. This is not limited herein.

For example, the second switch may include a second transistor. A gate of the second transistor is connected to a second isolation control line, and a first electrode and a second electrode of the second transistor are connected to the reference line between the sense amplifier and the precharge circuit. When the second isolation control line controls the second switch to be turned on, an end that is of the reference line and that is close to the precharge circuit is connected to an end that is of the reference line and that is close to the sense amplifier, and a signal can be transmitted between the two ends. When the second isolation control line controls the second switch to be turned off, the end that is of the reference line and that is close to the precharge circuit is disconnected from the end that is of the reference line and that is close to the sense amplifier, a signal cannot be transmitted between the two ends, and the precharge circuit is isolated from the sense amplifier.

During specific implementation, the second transistor may be a P-type transistor, or may be an N-type transistor. This is not limited herein. When the second transistor is the P-type transistor, the second transistor is turned on when the second isolation control line is at a low level, and the second transistor is turned off when the second isolation control line is at a high level. When the second transistor is the N-type transistor, the second transistor is turned on when the second isolation control line is at a high level, and the second transistor is turned off when the second isolation control line is at a low level.

The foregoing is merely an example for describing a specific structure of the second switch. During specific implementation, the specific structure of the second switch is not limited to the foregoing structure provided in embodiments of this disclosure, or may be another structure known by a person skilled in the art. This is not limited herein.

Optionally, both the first transistor and the second transistor are N-type transistors. Certainly, both the first transistor and the second transistor may be P-type transistors.

For example, when both the first transistor and the second transistor are the N-type transistors or P-type transistors, the first isolation control line and the second isolation control line may be a same control line, that is, the first transistor and the second transistor are controlled by the same isolation control line at the same time. This can reduce a quantity of control lines. In addition, the first transistor and the second transistor may be controlled synchronously, and no additional synchronization control circuit needs to be disposed. This can simplify a circuit structure.

For example, a differential input of the sense amplifier is connected to the bit line and the reference line, and a differential output of the sense amplifier is connected to the bit line and the reference line, to perform differential amplification on voltages of the bit line and the reference line.

For example, the sense amplifier may include an N-type third transistor, an N-type fourth transistor, a P-type fifth transistor, and a P-type sixth transistor. A first electrode of the third transistor is connected to the bit line, a second electrode of the third transistor is connected to a first reference voltage source, and a gate of the third transistor is connected to the reference line. A first electrode of the fourth transistor is connected to the reference line, a second electrode of the fourth transistor is connected to the first reference voltage source, and a gate of the fourth transistor is connected to the bit line. A first electrode of the fifth transistor is connected to the bit line, a second electrode of the fifth transistor is connected to a second reference voltage source, and a gate of the fifth transistor is connected to the reference line. A first electrode of the sixth transistor is connected to the reference line, a second electrode of the sixth transistor is connected to the second reference voltage source, and a gate of the sixth transistor is connected to the bit line.

For example, the precharge circuit may include a seventh transistor and an eighth transistor. A first electrode of the seventh transistor is connected to the bit line, a second electrode of the seventh transistor is connected to a precharge voltage source, and a gate of the seventh transistor is connected to a precharge control line. A first electrode of the eighth transistor is connected to the precharge voltage source, a second electrode of the eighth transistor is connected to the reference line, and a gate of the eighth transistor is connected to the precharge control line.

Optionally, the precharge circuit may further include a ninth transistor. A first electrode of the ninth transistor is connected to the bit line, a second electrode of the ninth transistor is connected to the reference line, and a gate of the ninth transistor is connected to the precharge control line. When the precharge circuit operates, the turned-on ninth transistor can further ensure that the voltages of the bit line and the reference line are equal.

Optionally, in this embodiment of this disclosure, the seventh transistor, the eighth transistor, and the ninth transistor in the precharge circuit are all N-channel transistors or all P-channel transistors. This is not limited herein.

Optionally, the bit line reading circuit provided in this embodiment of this disclosure may further include a selection circuit. The selection circuit is connected to the bit line and the reference line, and is configured to read data on the bit line and the reference line, or write data into the bit line and the reference line. The bit line reading circuit in this disclosure can not only implement data output, but also implement data writing.

For example, the selection circuit may include a tenth transistor and an eleventh transistor. A first electrode of the tenth transistor is configured to write data or read data, a second electrode of the tenth transistor is connected to the bit line, and a gate of the tenth transistor is connected to a first selection control line. A first electrode of the eleventh transistor is configured to write data or read data, a second electrode of the eleventh transistor is connected to the reference line, and a gate of the eleventh transistor is connected to a second selection control line. When the selection circuit operates, the first selection control line controls the tenth transistor to be turned on, to write data into the bit line or read data on the bit line via the turned-on tenth transistor. The second selection control line controls the eleventh transistor to be turned on, to write data into the reference line or read data on the reference line via the turned-on eleventh transistor.

Optionally, in this embodiment of this disclosure, the reference line connected to the bit line reading circuit may be a complementary bit line. Generally, a ferroelectric memory cell connected to the selected bit line and a ferroelectric memory cell connected to the complementary bit line are not connected to a same word line. In this way, when the bit line reading circuit reads the selected bit line, a voltage of the complementary bit line is not affected by the ferroelectric memory cell connected to the complementary bit line.

It should be noted that locations of the bit line BL and the complementary bit line /BL are not limited in this disclosure. For example, the bit line and the complementary bit line may be two bit lines in a same storage array in a memory, or may be two bit lines in different storage arrays in the memory.

It should be noted that the transistor mentioned in the foregoing embodiments of this disclosure may be a thin film transistor (TFT), or may be a metal-oxide-semiconductor field effect transistor (MOSFET). This is not limited herein. During specific implementation, one of the first electrode and the second electrode of the transistor is a source, and the other is a drain. The source and the drain of the transistor may be interchanged, and are not distinguished.

Optionally, in this disclosure, the bit line reading circuit may further include a controller. The controller is configured to turn off the first switch and the second switch when the sense amplifier performs differential amplification on the voltages of the bit line and the reference line for output, and turn off the first switch and the second switch when data is written into the bit line and the reference line.

For example, the controller is further configured to control the sense amplifier and the precharge circuit, so that the sense amplifier performs differential amplification on the voltages of the bit line and the reference line for output, and the precharge circuit precharges the bit line and the reference line.

For example, the controller may further control the selection circuit to read data on the bit line and the reference line, or control the selection circuit to write data into the bit line and the reference line.

During specific implementation, the controller may be implemented by using a logic circuit. A person skilled in the art may obtain a specific circuit structure based on a function. This is not limited herein.

Further, the controller may control operating time sequences of the first switch, the second switch, the precharge circuit, the sense amplifier, and the bit line reading circuit under control of a time sequence controller.

According to a second aspect, an embodiment of this disclosure further provides a reading method applied to the bit line reading circuit according to the first aspect or implementations of the first aspect. The reading method may include the following steps.

A first phase: A first switch and a second switch are turned on, and a precharge circuit precharges a bit line and a reference line.

A second phase: The first switch and the second switch are turned on, and the precharge circuit is disconnected.

A third phase: The first switch and the second switch are turned on, and a sense amplifier performs differential amplification on voltages of the bit line and the reference line.

A fourth phase: The first switch and the second switch are turned off, the precharge circuit precharges the bit line and the reference line, and the sense amplifier outputs the voltages of the bit line and the reference line, or writes data into the bit line and the reference line.

A fifth phase: The first switch and the second switch are turned on, and the precharge circuit is disconnected for a preset time and then connected.

The following describes an operating process of the bit line reading circuit provided in this embodiment of this disclosure with reference to a time sequence.

In phase 1 (node (a second electrode of a transistor in a ferroelectric memory cell) precharge phase), a word line connected to a selected ferroelectric memory cell is turned on for a period of time and then turned off. When the word line is turned on, a node, the bit line, and the reference line are pre-charged to 0 V by the precharge circuit.

In phase 2 (ferroelectric reversal phase), the bit line and the reference line are precharged to a reference voltage by the precharge circuit. At the same time, a voltage of a plate line connected to a selected ferroelectric capacitor is pulled up from $V_w/2$ to $V_w$, and the selected ferroelectric capacitor withstands a voltage difference of $V_w$. If data stored in the ferroelectric capacitor is opposite to a direction of an external electric field (data "1"), a polarization direction of the ferroelectric capacitor is reversed and a polarization charge is released. As a result, potential of the node increases significantly. If the data stored in the ferroelectric capacitor is the same as the direction of the external electric field (data "0"), the polarization direction of the ferroelectric capacitor does not change, and the potential of the node does not increase significantly.

In phase 3 (charge sharing phase), the precharge circuit is disconnected, the word line connected to the selected ferroelectric memory cell is turned on again, and charges of the node and the bit line are shared. Potential on the bit line depends on the potential of the node, the potential of the bit line increases (data "1") or decreases (data "0") a specific amplitude, and the reference line maintains at the reference voltage. Finally, the bit line and the reference line form a stable voltage difference.

In phase 4 (sense amplification phase), a first reference voltage source is pulled down to 0, a second reference voltage source SAP is pulled up to $V_w$, and the sense amplifier starts to operate. If the data stored in the selected ferroelectric capacitor in the ferroelectric memory cell is "1", a voltage of the bit line is pulled up to $V_w$ by the sense amplifier, and the reference line is pulled down to 0 by the sense amplifier. If the data stored in the selected ferroelectric capacitor in the ferroelectric memory cell is "0", the reference line is pulled up to $V_w$ by the sense amplifier, and the bit line is pulled down to 0 by the sense amplifier. In this way, the sense amplifier implements differential amplification on the voltages of the bit line and the reference line, and further reads information stored in the selected ferroelectric capacitor.

In phase 5 (read/write phase), the first switch and the second switch are turned off, the precharge circuit is connected, and the node, a bit line on the right of the first switch, and a reference line on the right of the second switch are precharged to $V_w/2$ by the precharge circuit. In a case of a read operation, a bit line on the left side of the first switch and a reference line on the left side of the second switch maintain voltages at phase 4. In a case of a write operation, the bit line on the left side of the first switch and the reference line on the left side of the second switch are rewritten into new voltages.

In phase 6 (write-back phase), the first switch and the second switch are turned on, and the precharge circuit is disconnected for a preset time and then connected. At the same time, the plate line is pulled down to 0 and then returns to $V_w/2$. The node, the bit line on the right side of the first switch, and the reference line on the right side of the second switch are driven to corresponding potential by the bit line on the left side of the first switch and a complementary bit line on the left side of the second switch. If a voltage of the node is $V_w$, the ferroelectric capacitor is written back to data “1”. If the voltage of the node is 0, the ferroelectric capacitor remains at data “0”. Then, the word line WL is turned off, and all operations in the write-back phase are completed.

It can be learned from the foregoing operating process that, due to introduction of the first switch and the second switch, in phase 5, the node, the bit line on the right side of the first switch, and the reference line on the right side of the second switch maintain at $V_w/2$, so that a voltage difference between two ends of the unselected ferroelectric capacitor is 0. This avoids “half-select” voltage interference of the unselected ferroelectric capacitor in this phase.

According to a third aspect, an embodiment of this disclosure further provides a memory, including a ferroelectric memory cell and the bit line reading circuit according to the first aspect or implementations of the first aspect. The ferroelectric memory cell includes a plurality of ferroelectric capacitors connected in parallel and a transistor connected to the plurality of ferroelectric capacitors. A gate of the transistor is connected to a word line, a first electrode of the transistor is connected to a bit line, and a second electrode of the transistor is connected to the plurality of ferroelectric capacitors connected in parallel. A problem-resolving principle of the memory is similar to that of the foregoing bit line reading circuit. Therefore, for implementation of the memory, refer to implementation of the foregoing bit line reading circuit. Repeated parts are not described again. The bit line reading circuit provided in this disclosure can shorten a time in which a ferroelectric capacitor is in a “half-select” state. Therefore, the memory including the bit line reading circuit can also shorten the time in which the ferroelectric capacitor is in the “half-select” state.

Optionally, in this embodiment of this disclosure, the memory may further include control logic, and the control logic is configured to: conduct the ferroelectric memory cell; and read a level on the bit line. In this embodiment of this disclosure, the control logic may be a controller in the memory. This is not limited herein.

According to a fourth aspect, an embodiment of this disclosure further provides an electronic device, including a processor and the memory that is coupled to the processor according to the third aspect.

In an embodiment, the processor may invoke a software program stored in the memory to perform a corresponding method and implement a corresponding function of the electronic device.

For technical effect that can be achieved in the third aspect and the fourth aspect, refer to descriptions of technical effect that can be achieved in any possible design in the first aspect. Details are not described herein again.

DESCRIPTIONS OF REFERENCE NUMERALS

Figure 1:
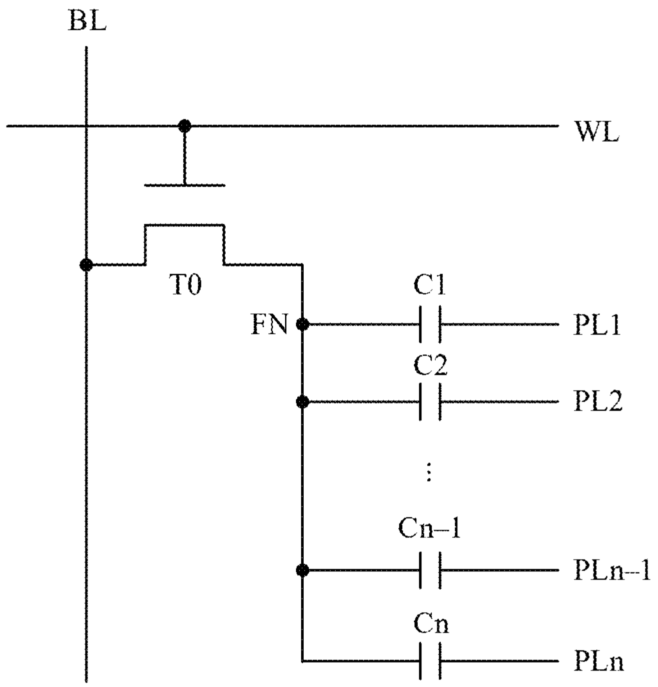
FIG. 1 is a diagram of a structure of a ferroelectric memory cell according to an embodiment of this disclosure.

1: memory;
2: processor;
10: memory cell array;
20: differential amplifier;
30: column decoder;
40: row decoder;
50: data buffer;
WL: word line;
201: bit line reading circuit;
101: ferroelectric memory cell;
001: precharge circuit;
002: sense amplifier;
0031: first switch;
0032: second switch;
004: selection circuit;
005: controller;
BL: bit line;
PCH: precharge control line;
REF: reference line;
/BL: complementary bit line;
PLi: plate line;
Ci: ferroelectric capacitor;
T1: first transistor;
T2: second transistor;
T3: third transistor;
T4: fourth transistor;
T5: fifth transistor;
T6: sixth transistor;
T7: seventh transistor;
T8: eighth transistor;
T9: ninth transistor;

T10: tenth transistor;
T11: eleventh transistor;
YS1: first selection control line;
YS2: second selection control line;
ISO1: first isolation control line;
ISO2: second isolation control line;
SAN: first reference voltage source;
SAP: second reference voltage source; and
VBLP: precharge voltage source.

DESCRIPTION OF EMBODIMENTS

To make objectives, technical solutions, and advantages of this disclosure clearer, the following further describes this disclosure in detail with reference to accompanying drawings.

Terms used in the following embodiments are merely intended to describe specific embodiments, but are not intended to limit this disclosure. Terms "one", "a", "the", "the foregoing", "this", and "the one" of singular forms used in this specification and the appended claims of this disclosure are also intended to include expressions such as "one or more", unless otherwise specified in the context clearly.

Reference to "an embodiment", "some embodiments", or the like described in this specification indicates that one or more embodiments of this disclosure include a specific feature, structure, or characteristic described with reference to embodiments. Therefore, statements such as "in an embodiment", "in some embodiments", "in some other embodiments", and "in other embodiments" that appear at different places in this specification do not necessarily mean referring to a same embodiment. Instead, the statements mean "one or more but not all of embodiments", unless otherwise emphasized in another manner. Terms "include", "contain", "have", and their variants all mean "include but are not limited to", unless otherwise emphasized in another manner.

A bit line reading circuit provided in embodiments of this disclosure may be used in a memory (for example, an internal memory and an external buffer) of an electronic device. The electronic device may be a computer system, for example, a server, a desktop computer, or a notebook computer. The memory in embodiments of this disclosure may be used in a last cache that is of the computer system and that is close to a central processing unit (CPU). In addition, the electronic device may be a mobile terminal product, for example, a mobile phone. A type of the electronic device is not limited in this disclosure. The memory may be a dynamic random access memory (DRAM). The memory in this disclosure may be configured to store data, and may write and read data. The memory may be a volatile memory or a non-volatile memory, or may include both a volatile memory and a non-volatile memory.

Figure 2:
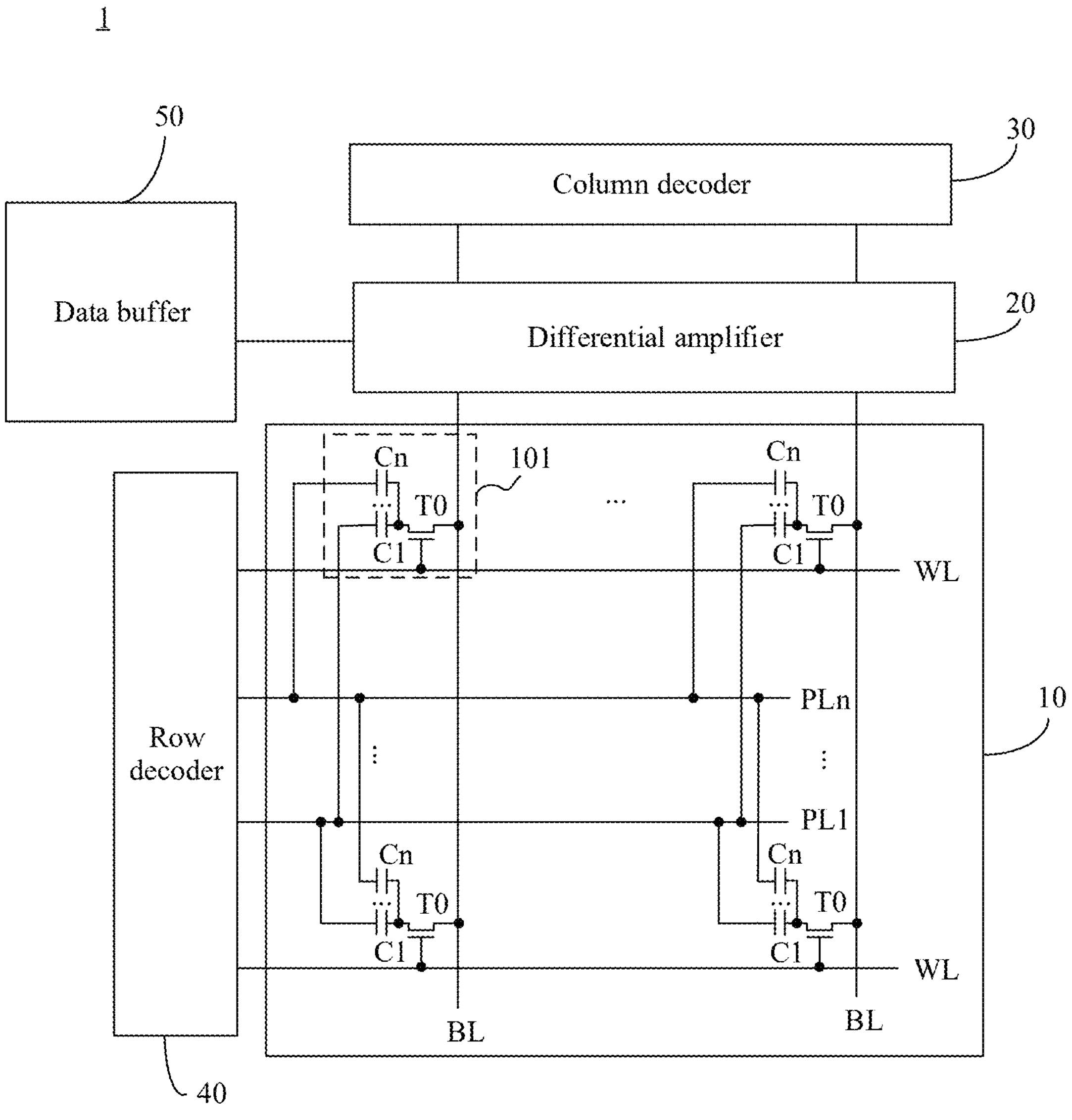
FIG. 2 is a diagram of a structure of a memory according to an embodiment of this disclosure.

FIG. 2 is an example of a diagram of a structure of a memory according to an embodiment of this disclosure. A memory 1 may include a memory cell array 10 and a differential amplifier 20.

The memory cell array 10 may include a plurality of ferroelectric memory cells 101 arranged in an array, and a word line WL and a bit line BL that are connected to each ferroelectric memory cell 101. Each ferroelectric memory cell 101 includes a transistor T0 and a plurality of ferroelectric capacitors C1 to Cn. Transistors TO in each row are connected to a same word line WL, and transistors TO in each column are connected to a same bit line BL. Generally, a source or a drain of the transistor T0 is connected to a bit line BL corresponding to the transistor T0, and a gate of the transistor T0 is connected to a word line WL corresponding to the transistor T0.

The differential amplifier 20 may include a plurality of bit line reading circuits (not shown in FIG. 1). Each bit line reading circuit is connected to a reference line and a bit line BL. The bit line reading circuit may perform differential amplification on voltages of the bit line BL and the reference line that are connected to the bit line reading circuit, and outputs a level of the bit line.

In this embodiment of this disclosure, the memory 1 may further include a column decoder 30, a row decoder 40, and a data buffer 50. The column decoder 30 is configured to decode bit line BL address information, to determine an address of a bit line BL to be read or written. The row decoder 40 is configured to decode plate line PLi (i is any number between 1 and n) and word line WL address information, to determine an address of a word line WL to be read or written and an address of a ferroelectric capacitor Ci to be written. The data buffer 50 is configured to transmit the level of the bit line output from the bit line reading circuit to an external circuit.

Figure 3:
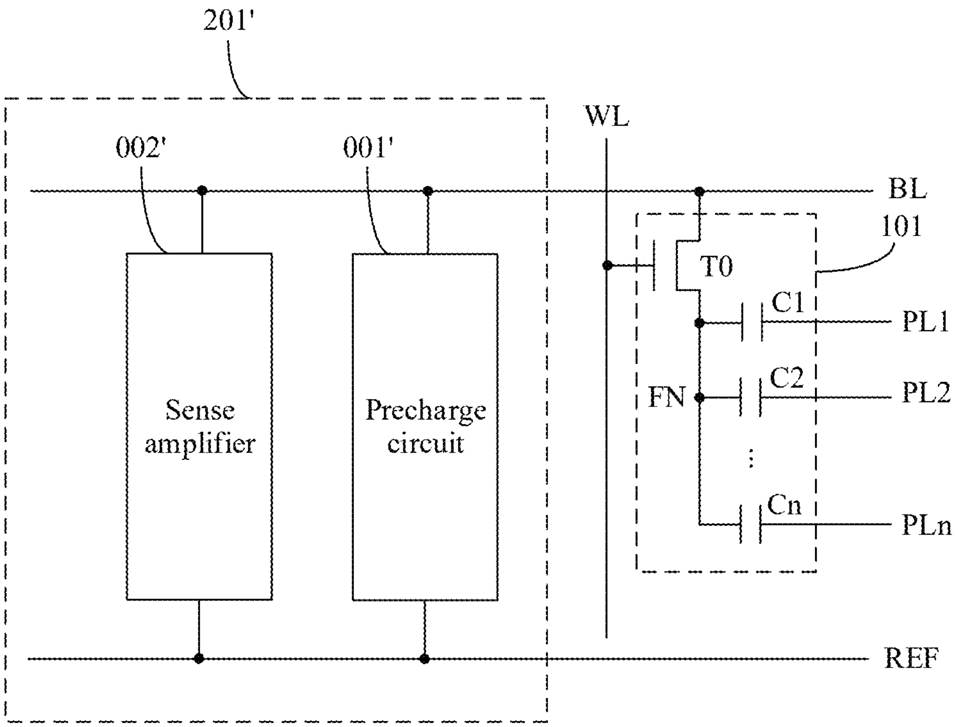
FIG. 3 is a diagram of a structure of a common bit line reading circuit.

FIG. 3 is a diagram of a structure of a common bit line reading circuit 201'. The bit line reading circuit 201' includes a precharge circuit 001' and a sense amplifier (SA) 002'. When the bit line reading circuit 201' operates, the sense amplifier 002' needs to perform voltage differential amplification after the precharge circuit 001' completes precharge, and read a result after the sense amplifier 002' completes voltage differential amplification.

Still refer to FIG. 3. In a 1TnC ferroelectric memory cell 101, ends of n ferroelectric capacitors C1 to Cn are respectively controlled by n plate lines PLI to PLn, and the other ends of the n ferroelectric capacitors C1 to Cn are connected to a common node FN in the ferroelectric memory cell 101. The node FN is connected to a source of a field effect transistor T0, a drain of the field effect transistor T0 is connected to a common bit line BL, and a gate of the field effect transistor T0 is connected to a word line WL. Because the ends of the n ferroelectric capacitors C1 to Cn are connected to the common node FN, to distinguish a selected ferroelectric capacitor from unselected n−1 ferroelectric capacitors in the n ferroelectric capacitors C1 to Cn, the unselected ferroelectric capacitors withstand a "half-select" external voltage $V_w/2$ in a read/write process, that is, a half of a voltage $V_w$ withstood by the selected ferroelectric capacitor. Generally, the "half-select" voltage $V_w/2$ is less than a coercive field voltage $V_c$, and the unselected ferroelectric capacitors do not release significant polarization charges. To be compatible with the conventional DDR DRAM protocol, after a row of ferroelectric memory cells 101 are activated and before a next precharge command, a node FN in a selected ferroelectric memory cell 101 is in a voltage state of 0 or $V_w$ for a long time because the node FN is connected to the sense amplifier 002', and an unselected plate line PL is in $V_w/2$. Therefore, the unselected ferroelectric capacitors (for example, C2 to Cn in FIG. 3) in the ferroelectric memory cell 101 are in a "half-select" voltage state. However, if the ferroelectric capacitor is in the "half-select" voltage for a long time, internal spontaneous polarization intensity of the ferroelectric capacitor also obviously changes. This further affects a size of an information reading window. To improve a change of a polarization state of the ferroelectric capacitor due to interference of the "half-select" voltage for a long time, it is usually necessary to perform a periodic refresh operation on the ferroelectric capacitor. Therefore, it is necessary to prevent the ferroelectric capacitor from being in the "half-select" state for a long time to ensure normal operation of a ferroelectric memory. This also reduces a frequency of refreshing the ferroelectric capacitor.

In view of this, an embodiment of this disclosure provides a bit line reading circuit, to shorten a time in which the ferroelectric capacitor is in the "half-select" state in a read/write process of the 1TnC ferroelectric memory cell.

Figure 4:
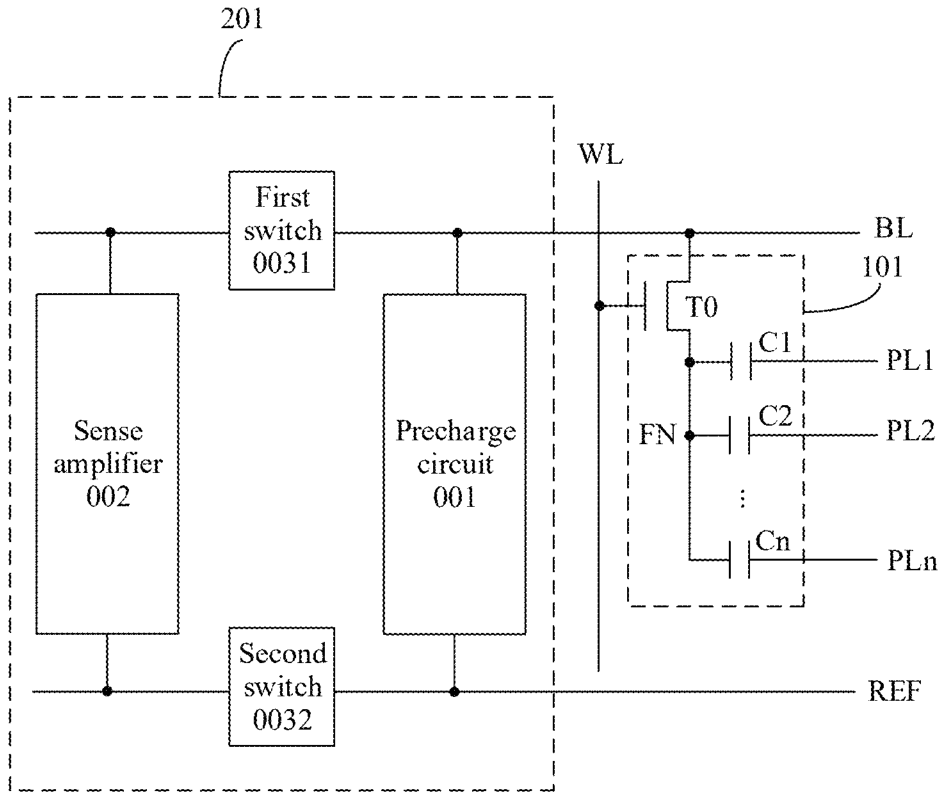
FIG. 4 is a diagram of a structure of a bit line reading circuit according to an embodiment of this disclosure.

FIG. 4 is an example of a diagram of a structure of a bit line reading circuit according to an embodiment of this disclosure. The bit line reading circuit 201 is configured to read a level from a ferroelectric memory cell 101. The bit line reading circuit 201 may include a bit line BL, a reference line REF, a precharge circuit 001, a sense amplifier 002, a first switch 0031, and a second switch 0032. The bit line BL is connected to the ferroelectric memory cell 101. The ferroelectric memory cell 101 generally includes n ferroelectric capacitors C1 to Cn and one transistor T0, where n is an integer greater than or equal to 2. A gate of the transistor T0 is connected to a word line WL, a first electrode of the transistor T0 is connected to a bit line BL, and a second electrode of the transistor T0 is connected to a node FN. The node FN is connected to one end of each ferroelectric capacitor Ci (i is any number between 1 and N) in the n ferroelectric capacitors C1 to Cn, and the other end of each ferroelectric capacitor Ci is correspondingly connected to a plate line PLi. The sense amplifier 002 is separately connected to the bit line BL and the reference line REF, and is configured to perform differential amplification on voltages of the bit line BL and the reference line REF. The precharge circuit 001 is separately connected to the bit line BL and the reference line REF, and is configured to precharge the bit line BL and the reference line REF. The first switch 0031 is connected to the bit line BL between the sense amplifier 002 and the precharge circuit, and is configured to connect or disconnect the bit line BL between the sense amplifier 002 and the precharge circuit 001. The second switch 0032 is connected to the reference line REF between the sense amplifier 002 and the precharge circuit 001, and is configured to connect or disconnect the reference line REF between the sense amplifier 002 and the precharge circuit 001. In this way, when the bit line reading circuit 201 is in a read/write phase, the sense amplifier 002 operates normally, the first switch 0031 disconnects the bit line BL between the sense amplifier 002 and the precharge circuit 001, and the second switch 0032 disconnects the reference line REF between the sense amplifier 002 and the precharge circuit 001. Therefore, a voltage of the bit line BL may be pulled by the precharge circuit 001 to a voltage the same as a voltage of a plate line PLi connected to an unselected ferroelectric capacitor Ci in the ferroelectric memory cell 101. For example, if the voltage of the plate line PLi connected to the unselected ferroelectric capacitor Ci is $V_w/2$, a voltage of the bit line BL is pulled to $V_w/2$ by the precharge circuit 001. In this way, voltages at two ends of the unselected ferroelectric capacitor Ci are the same, so that the unselected ferroelectric capacitor is not in a "half-select" state in the read/write phase. This shortens a time in which the ferroelectric capacitor is in the "half-select" state.

It should be noted that in this disclosure, compared with the sense amplifier 002, the precharge circuit 001 is closer to the ferroelectric memory cell 101 in a connection location on the bit line BL, as shown in FIG. 4, to be specific, information of the ferroelectric memory cell 101 is first transmitted to the precharge circuit 001 through the bit line BL, and then transmitted to the sense amplifier 002 via the first switch 0031. Correspondingly, a signal transmitted by the precharge circuit 001 to the reference line REF needs to be transmitted to the sense amplifier 002 via the second switch 0032.

The following describes this disclosure in detail with reference to specific embodiments. It should be noted that embodiments are intended to better explain this disclosure, but are not intended to limit this disclosure.

Figure 5:
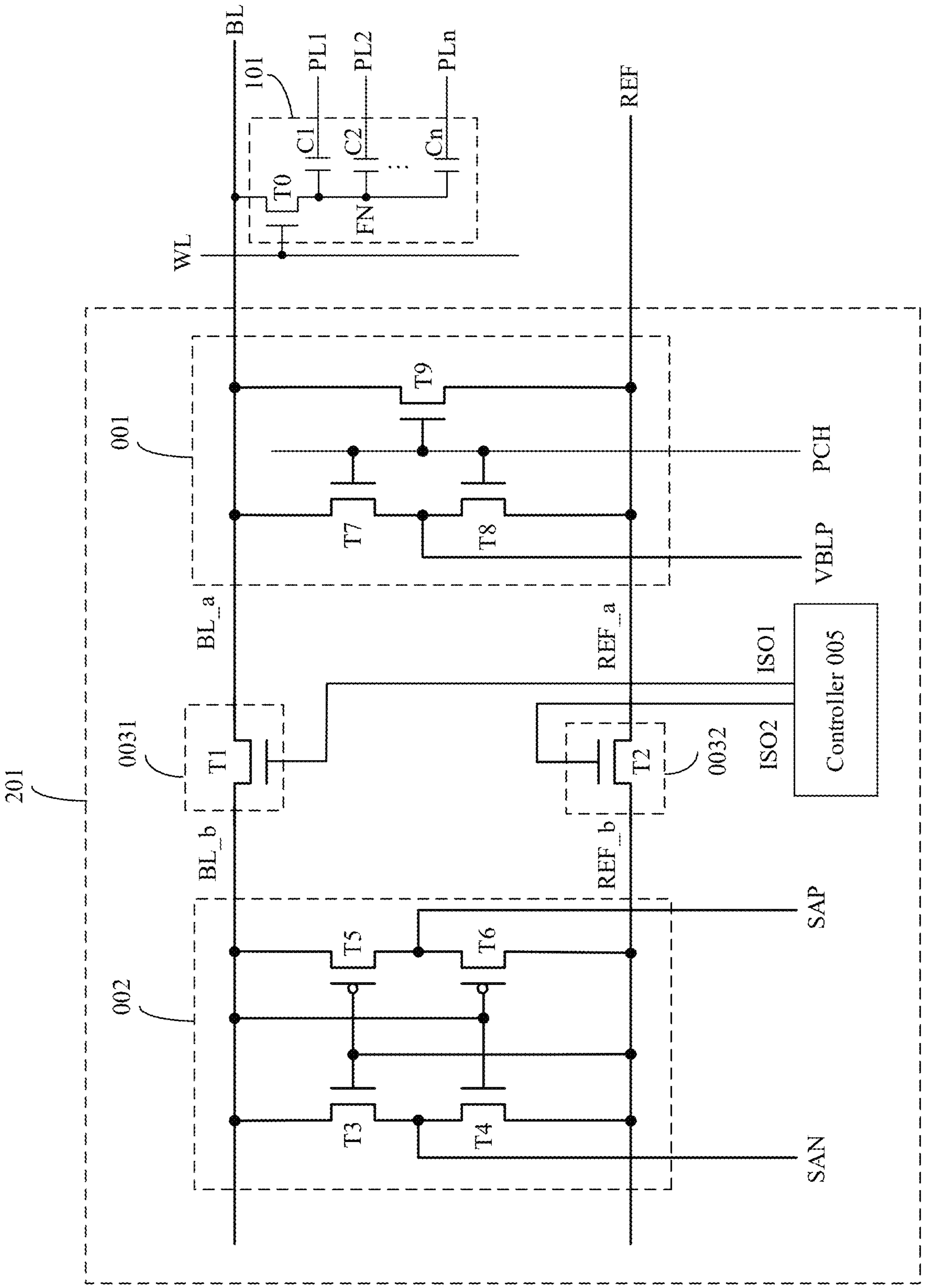
FIG. 5 is a diagram of a specific structure of a bit line reading circuit according to an embodiment of this disclosure.

FIG. 5 is an example of a diagram of a specific structure of a bit line reading circuit according to an embodiment of this disclosure. In the bit line reading circuit 201, a first switch 0031 may include a first transistor T1. A gate of the first transistor T1 is connected to a first isolation control line ISO1. A first electrode and a second electrode of the first transistor T1 are connected to a bit line BL between a sense amplifier 002 and a precharge circuit 001. The first electrode of the first transistor T1 is connected to an end BL_a that is of the bit line BL and that is close to the precharge circuit 001, and the second electrode of the first transistor T1 is connected to an end BL_b that is of the bit line BL and that is close to the sense amplifier 002. When the first isolation control line ISO1 controls the first switch 0031 to be turned on, the end BL_a that is of the bit line BL and that is close to the precharge circuit 001 is connected to the end BL_b that is of the bit line BL and that is close to the sense amplifier 002, and a signal can be transmitted between the two ends. When the first isolation control line ISO1 controls the first switch 0031 to be turned off, the end BL_a that is of the bit line BL and that is close to the precharge circuit 001 is disconnected from the end BL_b that is of the bit line BL and that is close to the sense amplifier 002, a signal cannot be transmitted between the two ends, and the precharge circuit 001 is isolated from the sense amplifier 002.

During specific implementation, the first transistor T1 may be a P-type transistor, or may be an N-type transistor. This is not limited herein. When the first transistor T1 is the P-type transistor, the first transistor T1 is turned on when the first isolation control line ISO1 is at a low level, and the first transistor T1 is turned off when the first isolation control line ISO1 is at a high level. When the first transistor T1 is the N-type transistor, the first transistor T1 is turned on when the first isolation control line ISO1 is at a high level, and the first transistor T1 is turned off when the first isolation control line ISO1 is at a low level.

The foregoing is merely an example for describing a specific structure of the first switch. During specific implementation, the specific structure of the first switch is not limited to the foregoing structure provided in embodiments of this disclosure, or may be another structure known by a person skilled in the art. This is not limited herein.

Still refer to FIG. 5. In the bit line reading circuit 201, a second switch 0032 may include a second transistor T2. A gate of the second transistor T2 is connected to a second isolation control line ISO2. A first electrode and a second electrode of the second transistor T2 are connected to a reference line REF between the sense amplifier 002 and the precharge circuit 001. The first electrode of the second transistor T2 is connected to an end REF_a that is of the reference line REF and that is close to the precharge circuit 001, and the second electrode of the second transistor T2 is connected to an end REF_b that is of the reference line REF and that is close to the sense amplifier 002. When the second isolation control line ISO2 controls the second switch 0032 to be turned on, the end REF_a that is of the reference line REF and that is close to the precharge circuit 001 is connected to the end REF_b that is of the reference line REF and that is close to the sense amplifier 002, and a signal can be transmitted between the two ends. When the second isolation control line ISO2 controls the second switch 0032 to be turned off, the end REF_a that is of the reference line REF and that is close to the precharge circuit 001 is disconnected from the end REF_b that is of the reference line REF and that is close to the sense amplifier 002, a signal cannot be transmitted between the two ends, and the precharge circuit 001 is isolated from the sense amplifier 002.

During specific implementation, the second transistor T2 may be a P-type transistor, or may be an N-type transistor. This is not limited herein. When the second transistor T2 is the P-type transistor, the second transistor T2 is turned on when the second isolation control line ISO2 is at a low level, and the second transistor T2 is turned off when the second isolation control line ISO2 is at a high level. When the second transistor T2 is the N-type transistor, the second transistor T2 is turned on when the second isolation control line ISO2 is at a high level, and the second transistor T2 is turned off when the second isolation control line ISO2 is at a low level.

The foregoing is merely an example for describing a specific structure of the second switch. During specific implementation, the specific structure of the second switch is not limited to the foregoing structure provided in embodiments of this disclosure, or may be another structure known by a person skilled in the art. This is not limited herein.

Figure 6:
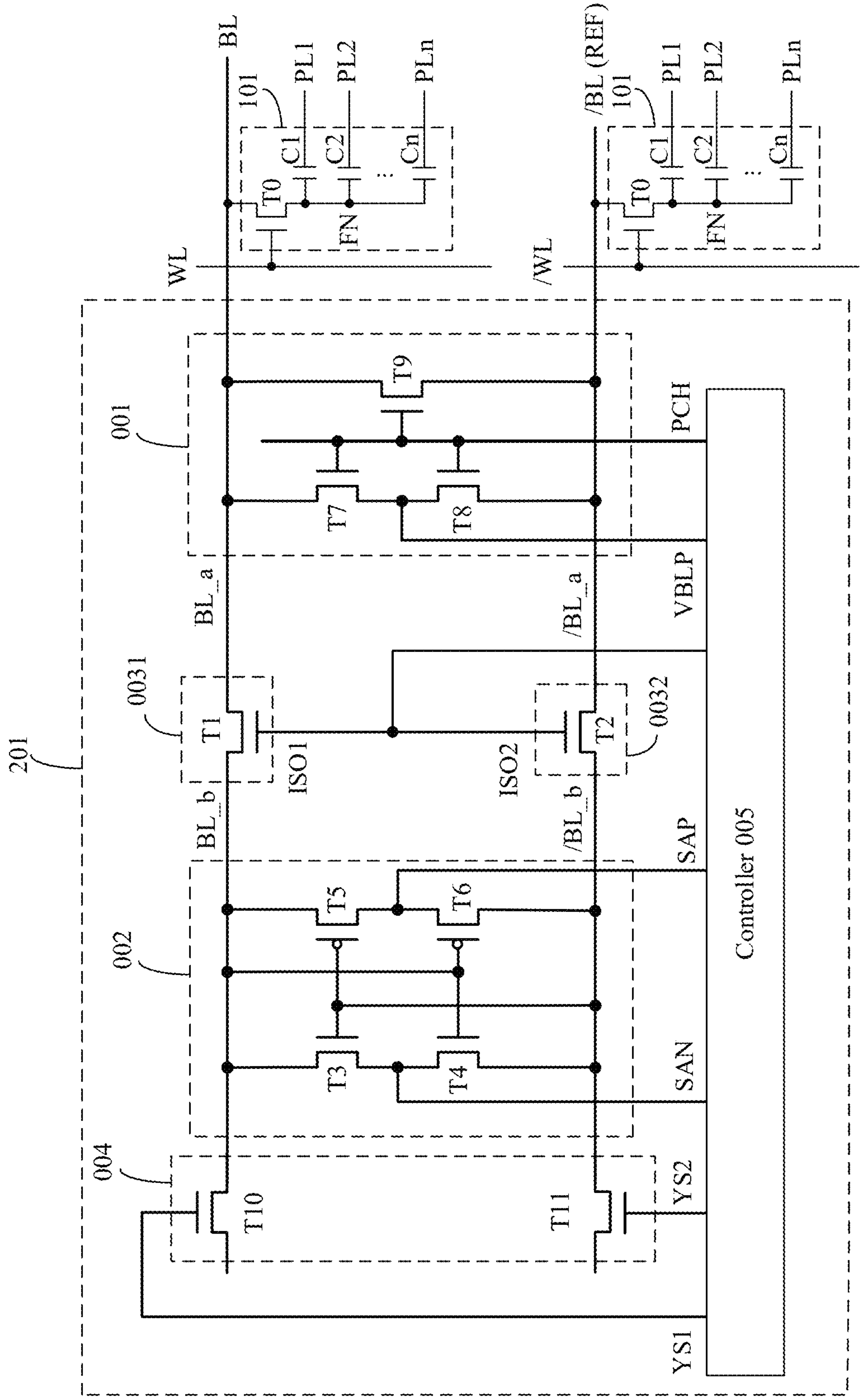
FIG. 6 is a diagram of another specific structure of a bit line reading circuit according to an embodiment of this disclosure.

Optionally, both the first transistor T1 and the second transistor T2 may be N-type transistors shown in FIG. 6. Certainly, both the first transistor T1 and the second transistor T2 may be P-type transistors.

For example, when both the first transistor T1 and the second transistor T2 are the N-type transistors or P-type transistors, as shown in FIG. 6, the first isolation control line ISO1 and the second isolation control line ISO2 may be a same control line, in other words, the first transistor T1 and the second transistor T2 are controlled by the same isolation control line at the same time. This can reduce a quantity of control lines. In addition, the first transistor T1 and the second transistor T2 may be controlled synchronously, and no additional synchronization control circuit needs to be disposed. This can simplify a circuit structure.

For example, as shown in FIG. 5 and FIG. 6, a differential input of the sense amplifier 002 is connected to the bit line BL and the reference line REF, and a differential output of the sense amplifier 002 is connected to the bit line BL and the reference line REF, to perform differential amplification on voltages of the bit line BL and the reference line REF.

For example, as shown in FIG. 5 and FIG. 6, the sense amplifier 002 may include an N-type third transistor T3, an N-type fourth transistor T4, a P-type fifth transistor T5, and a P-type sixth transistor T6. A first electrode of the third transistor T3 is connected to the bit line BL, a second electrode of the third transistor T3 is connected to a first reference voltage source SAN, and a gate of the third transistor T3 is connected to the reference line REF. A first electrode of the fourth transistor T4 is connected to the reference line REF, a second electrode of the fourth transistor T4 is connected to the first reference voltage source SAN, and a gate of the fourth transistor T4 is connected to the bit line BL. A first electrode of the fifth transistor T5 is connected to the bit line BL, a second electrode of the fifth transistor T5 is connected to a second reference voltage source SAP, and a gate of the fifth transistor T5 is connected to the reference line REF. A first electrode of the sixth transistor T6 is connected to the reference line REF, a second electrode of the sixth transistor T6 is connected to the second reference voltage source SAP, and a gate of the sixth transistor T6 is connected to the bit line BL.

For example, as shown in FIG. 5 and FIG. 6, the precharge circuit 001 may include a seventh transistor T7 and an eighth transistor T8. A first electrode of the seventh transistor T7 is connected to the bit line BL, a second electrode of the seventh transistor T7 is connected to a precharge voltage source VBLP, and a gate of the seventh transistor T7 is connected to a precharge control line PCH. A first electrode of the eighth transistor T8 is connected to the precharge voltage source VBLP, a second electrode of the eighth transistor T8 is connected to the reference line REF, and a gate of the eighth transistor T8 is connected to the precharge control line PCH. When the precharge circuit 001 operates, the precharge control line PCH controls both the seventh transistor T7 and the eighth transistor T8 to be turned on, and a voltage of the precharge voltage source VBLP is transmitted to the bit line BL and the reference line REF through the seventh transistor T7 and the eighth transistor T8 respectively. In this way, voltages of the bit line BL and the reference line REF are equal.

Optionally, in this disclosure, the precharge circuit 001 may further include a ninth transistor T9. A first electrode of the ninth transistor T9 is connected to the bit line BL, a second electrode of the ninth transistor T9 is connected to the reference line REF, and a gate of the ninth transistor T9 is connected to the precharge control line PCH. When the precharge circuit 001 operates, the precharge control line PCH controls the ninth transistor T9 to be turned on, and the turned-on ninth transistor T9 may further ensure that voltages of the bit line BL and the reference line REF are equal.

Optionally, in this embodiment of this disclosure, the seventh transistor T7, the eighth transistor T8, and the ninth transistor T9 in the precharge circuit 001 are all N-channel transistors or all P-channel transistors. This is not limited herein.

Optionally, as shown in FIG. 6, the bit line reading circuit provided in this embodiment of this disclosure may further include a selection circuit 004. The selection circuit 004 is connected to the bit line BL and the reference line REF, and is configured to read data on the bit line BL and the reference line REF, or write data into the bit line BL and the reference line REF. The bit line reading circuit 201 in this disclosure can not only implement data output, but also implement data writing.

For example, as shown in FIG. 6, the selection circuit 004 may include a tenth transistor T10 and an eleventh transistor T11. A first electrode of the tenth transistor T10 is configured to write data or read data, a second electrode of the tenth transistor T10 is connected to the bit line BL, and a gate of the tenth transistor T10 is connected to a first selection control line YS1. A first electrode of the eleventh transistor T11 is configured to write data or read data, a second electrode of the eleventh transistor T11 is connected to the reference line REF, and a gate of the eleventh transistor REF is connected to a second selection control line YS2. When the selection circuit 004 operates, the first selection control line YS1 controls the tenth transistor T10 to be turned on, to write data into the bit line BL or read data on the bit line BL via the turned-on tenth transistor T10. The second selection control line YS2 controls the eleventh transistor T11 to be turned on, to write data into the reference line REF or read data on the reference line REF via the turned-on eleventh transistor T11.

Optionally, in this embodiment of this disclosure, as shown in FIG. 6, the reference line REF connected to the bit line reading circuit 201 may be a complementary bit line /BL. Generally, a ferroelectric memory cell 101 connected to the selected bit line BL and a ferroelectric memory cell 101 connected to the complementary bit line /BL are not connected to a same word line. For example, in FIG. 6, a word line WL connected to the ferroelectric memory cell 101 connected to the selected bit line BL and a word line/WL connected to the ferroelectric memory cell 101 connected to the unselected bit line /BL are different word lines. In this way, when the bit line reading circuit reads the selected bit line BL, a voltage of the complementary bit line /BL is not affected by the ferroelectric memory cell 101 connected to the complementary bit line /BL.

It should be noted that locations of the bit line BL and the complementary bit line /BL are not limited in this disclosure. For example, the bit line BL and the complementary bit line /BL may be two bit lines in a same storage array in a memory, or may be two bit lines in different storage arrays in the memory.

It should be noted that the transistor mentioned in the foregoing embodiments of this disclosure may be a thin film transistor, or may be a metal-oxide-semiconductor field effect transistor. This is not limited herein. During specific implementation, one of the first electrode and the second electrode of the transistor is a source, and the other is a drain. The source and the drain of the transistor may be interchanged, and are not distinguished.

Optionally, in this disclosure, as shown in FIG. 5, the bit line reading circuit 201 may further include a controller 005. The controller 005 is configured to turn off the first switch 0031 and the second switch 0032 when the sense amplifier 002 performs differential amplification on the voltages of the bit line BL and the reference line REF for output, and turn off the first switch 0031 and the second switch 0032 when data is written into the bit line BL and the reference line REF.

For example, as shown in FIG. 6, the controller 005 is further configured to control the sense amplifier 002 and the precharge circuit 001, so that the sense amplifier 002 performs differential amplification on the voltages of the bit line BL and the reference line REF for output, and the precharge circuit 001 precharges the bit line BL and the reference line REF.

For example, as shown in FIG. 6, the controller 005 may further control the selection circuit 004 to read data on the bit line BL and the reference line REF, or control the selection circuit 004 to write data into the bit line BL and the reference line REF.

During specific implementation, the controller may be implemented by using a logic circuit. A person skilled in the art may obtain a specific circuit structure based on a function. This is not limited herein.

Further, the controller may control operating time sequences of the first switch, the second switch, the precharge circuit, the sense amplifier, and the bit line reading circuit under control of a time sequence controller.

Correspondingly, an embodiment of this disclosure further provides a reading method applied to any one of the foregoing bit line reading circuits. The reading method may include the following steps.

A first phase: A first switch and a second switch are turned on, and a precharge circuit precharges a bit line and a reference line.

A second phase: The first switch and the second switch are turned on, and the precharge circuit is disconnected.

A third phase: The first switch and the second switch are turned on, and a sense amplifier performs differential amplification on voltages of the bit line and the reference line.

A fourth phase: The first switch and the second switch are turned off, the precharge circuit precharges the bit line and the reference line, and the sense amplifier outputs the voltages of the bit line and the reference line, or writes data into the bit line and the reference line.

A fifth phase: The first switch and the second switch are turned on, and the precharge circuit is disconnected for a preset time and then connected.

Figure 7:
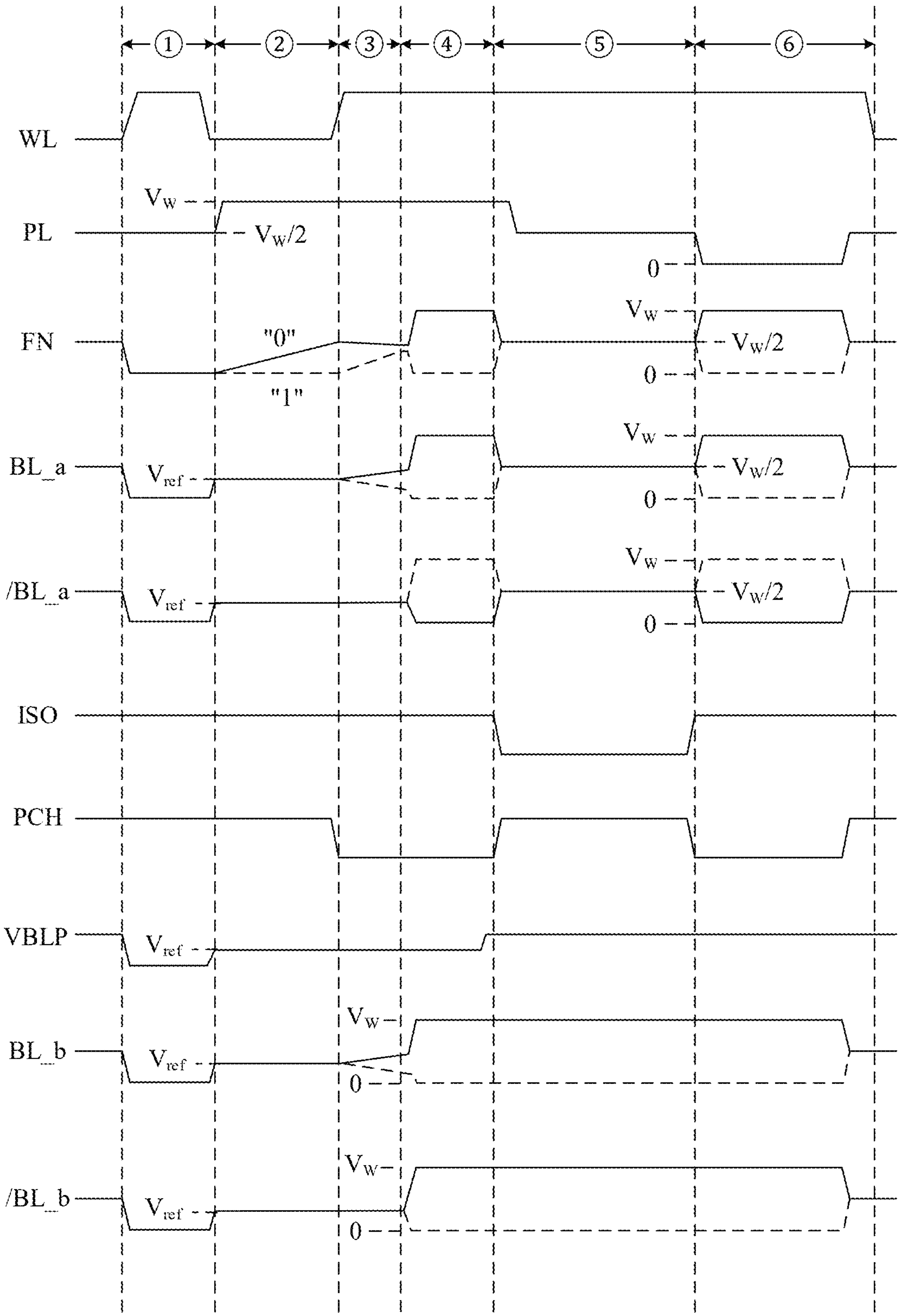
FIG. 7 is a circuit time sequence diagram corresponding to the bit line reading circuit shown in FIG. 6.

The following describes an operating process of the bit line reading circuit provided in this embodiment of this disclosure with reference to a time sequence. In an embodiment, the bit line reading circuit shown in FIG. 6 is used as an example, and an input time sequence diagram corresponding to the bit line reading circuit is shown in FIG. 7.

In phase 1 (FN precharge phase), a word line WL connected to a selected ferroelectric memory cell 101 is turned on for a period of time and then turned off. During a turn-on period of the word line WL, a node FN, a bit line BL, and a complementary bit line /BL are precharged to 0 V by a precharge circuit 001.

In phase 2 (ferroelectric reversal phase), the bit line BL and the complementary bit line /BL are precharged to a reference voltage $V_{ref}$ by the precharge circuit 001, a voltage of a plate line PLI connected to a selected ferroelectric capacitor, for example, C1, is pulled up from $V_w/2$ to $V_w$, and the selected ferroelectric capacitor C1 withstands a voltage difference of $V_w$. If a polarization direction of the ferroelectric capacitor C1 is opposite to a direction of an external electric field (data "1"), a polarization direction of the ferroelectric capacitor C1 is reversed and a polarization charge is released. As a result, potential of the node FN increases significantly. If the data stored in the ferroelectric capacitor C1 is the same as the direction of the external electric field (data "0"), the polarization direction of the ferroelectric capacitor C1 does not change, and the potential of the node FN does not increase significantly.

In phase 3 (charge sharing phase), the precharge circuit 001 is disconnected, the word line WL connected to the selected ferroelectric memory cell 101 is turned on again, and charges of the node FN and the bit line BL are shared. Potential of the bit line BL depends on the potential of the node FN, the potential of the bit line BL increases (data "1") or decreases (data "0") a specific amplitude, and the complementary bit line /BL maintains at the reference voltage $V_{ref}$. Finally, the bit line BL and the complementary bit line /BL form a stable voltage difference.

In phase 4 (sense amplification phase), a first reference voltage source SAN is pulled down to 0, a second reference voltage source SAP is pulled up to $V_w$, and the sense amplifier 002 starts to operate. If the data stored in the selected ferroelectric capacitor C1 in the ferroelectric memory cell 101 is "1", the voltage of the bit line BL increases, and consequently a fourth transistor T4 is turned on first. A voltage of the first reference voltage source SAN is transmitted to the complementary bit line /BL via the fourth transistor T4, and the voltage of the complementary bit line /BL is pulled down. The complementary bit line /BL controls a fifth transistor T5 to be turned on. A voltage of the second reference voltage source SAP is transmitted to the bit line BL via the fifth transistor T5, and the voltage of the bit line BL is pulled up. Through continuous positive feedback, the a voltage of bit line BL is pulled up to $V_w$, and the complementary bit line /BL is pulled down to 0. If the data stored in the selected ferroelectric capacitor C1 in the ferroelectric memory cell 101 is "0", the voltage of the bit line BL decreases. A sixth transistor T6 is turned on first, the voltage of the second reference voltage source SAP is transmitted to the complementary bit line /BL via the sixth transistor T6, and the voltage of the complementary bit line /BL is pulled up. The complementary bit line /BL controls a third transistor T3 to be turned on, the voltage of the first reference voltage source SAN is transmitted to the bit line BL via the third transistor T3, and the voltage of the bit line BL is pulled down. Through continuous positive feedback, the complementary bit line /BL is pulled up to $V_w$, and the bit line BL is pulled down to 0. In this way, the sense amplifier 002 implements differential amplification on the voltages of the bit line BL and the complementary bit line /BL, and further reads information stored in the selected ferroelectric capacitor C1.

In phase 5 (read/write phase), a first transistor T1 and a second transistor T2 are turned off, and the precharge circuit 001 is connected. The node FN, a bit line BL_a on the right side of the first transistor T1, and a complementary bit line /BL_a on the right side of the second transistor T2 are precharged to $V_w/2$ by the precharge circuit. In a case of a read operation, a bit line BL_b on the left side of the first transistor T1 and a complementary bit line /BL_b on the left side of the second transistor T2 maintain voltages in phase 4. If a case of a write operation, the bit line BL_b on the left side of the first transistor T1 and the complementary bit line /BL_b on the left side of the second transistor T2 are rewritten into new voltages.

In phase 6 (write-back phase), the first transistor T1 and the second transistor T2 are turned on, and the precharge circuit 001 is first disconnected and then connected. At the same time, the plate line PLI is pulled down to 0 and then returns to $V_w/2$, the node FN, the bit line BL_a on the right side of the first transistor T1, and the complementary bit line /BL_a on the right side of the second transistor T2 are driven to corresponding potential by the bit line BL_b on the left side of the first transistor T1 and the complementary bit line /BL_b on the left side of the second transistor T2. If the voltage of the node FN is $V_w$, the ferroelectric capacitor C1 is written back to data "1". If the voltage of the node FN is 0, the ferroelectric capacitor C1 remains at data "0". Then, the word line WL is turned off, and all operations in the write-back phase are completed.

It can be learned from the foregoing operating process that, due to introduction of the first transistor T1 and the second transistor T2, in phase 5, the node FN, the bit line BL_a on the right side of the first transistor T1, and the complementary bit line /BL_a on the right side of the second transistor T2 maintain at $V_w/2$. Therefore, a voltage difference between two ends of each of the non-selected ferroelectric capacitors C2 to Cn is 0. This avoids "half-select" voltage interference of the non-selected ferroelectric capacitors C2 to Cn in this phase.

The bit line reading circuit provided in this embodiment of this disclosure may be applied to a memory. The memory provided in this disclosure includes the bit line reading circuit in any one of the foregoing technical solutions of this disclosure and a ferroelectric memory cell. The ferroelectric memory cell includes a plurality of ferroelectric capacitors connected in parallel and a transistor connected to the plurality of ferroelectric capacitors. A gate of the transistor is connected to a word line, a first electrode of the transistor is connected to a bit line, and a second electrode of the transistor is connected to the plurality of ferroelectric capacitors connected in parallel. During specific implementation, for a structure of the memory, refer to FIG. 2. A problem-resolving principle of the memory is similar to that of the foregoing bit line reading circuit. Therefore, for implementation of the memory, refer to the implementation of the foregoing bit line reading circuit. Repeated parts are not described again. The bit line reading circuit provided in this disclosure can shorten a time in which a ferroelectric capacitor is in a "half-select" state. Therefore, the memory including the bit line reading circuit can also shorten the time in which the ferroelectric capacitor is in the "half-select" state.

Optionally, in this embodiment of this disclosure, the memory may further include control logic, and the control logic is configured to: conduct the ferroelectric memory cell; and read a level on the bit line. In this embodiment of this disclosure, the control logic may be a controller in the memory. This is not limited herein.

Figure 8:
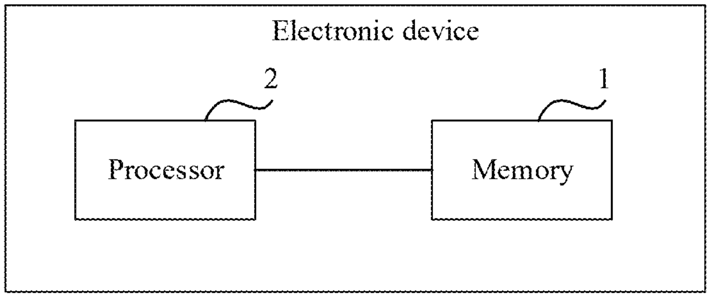
FIG. 8 is a diagram of a structure of an electronic device according to an embodiment of this disclosure.

Based on a same technical concept, an embodiment of this disclosure further provides an electronic device. Refer to FIG. 8. The electronic device includes a processor 2 and a memory 1 coupled to the processor. The memory 1 may be the memory shown in FIG. 2.

In an embodiment, the processor 2 may invoke a software program stored in the memory 1 to perform a corresponding method and implement a corresponding function of the electronic device.

It is clearly that a person skilled in the art can make various modifications and variations to this disclosure without departing from the spirit and scope of this disclosure. This disclosure is intended to cover these modifications and variations of this disclosure provided that they fall within the scope of protection defined by the following claims and their equivalent technologies.

The invention claimed is:

1. A bit line reading circuit, configured to read a level from a ferroelectric memory cell, wherein the ferroelectric memory cell comprises a plurality of ferroelectric capacitors connected in parallel and a transistor connected to the plurality of ferroelectric capacitors, wherein the bit line reading circuit comprises:
- a bit line, wherein the bit line is connected to the ferroelectric memory cell;
- a reference line;
- a sense amplifier, wherein the sense amplifier is separately connected to the bit line and the reference line, and is configured to perform differential amplification on voltages of the bit line and the reference line for output;
- a precharge circuit, wherein the precharge circuit is separately connected to the bit line and the reference line, and is configured to precharge the bit line and the reference line;
- a first switch, wherein the first switch is connected to the bit line between the sense amplifier and the precharge circuit; and
- a second switch, wherein the second switch is connected to the reference line between the sense amplifier and the precharge circuit.

2. The bit line reading circuit according to claim 1, wherein the bit line reading circuit further comprises a controller, wherein
- the controller is configured to turn off the first switch and the second switch when the sense amplifier performs differential amplification on the voltages of the bit line and the reference line for output, and turn off the first switch and the second switch when data is written into the bit line and the reference line.

3. The bit line reading circuit according to claim 2, wherein the controller is further configured to control the sense amplifier and the precharge circuit, so that the sense amplifier performs differential amplification on the voltages of the bit line and the reference line for output, and the precharge circuit precharges the bit line and the reference line.

4. The bit line reading circuit according to claim 1, further comprising at least one of:

a first transistor in the first switch, wherein a gate of the first transistor is connected to a first isolation control line, and a first electrode and a second electrode of the first transistor are connected to the bit line between the sense amplifier and the precharge circuit; or a second transistor in the second switch, wherein a gate of the second transistor is connected to a second isolation control line, and a first electrode and a second electrode of the second transistor are connected to the reference line between the sense amplifier and the precharge circuit.

5. The bit line reading circuit according to claim 4, wherein both the first transistor and the second transistor are N-type transistors or P-type transistors.

6. The bit line reading circuit according to claim 5, wherein the first isolation control line and the second isolation control line are a same control line.

7. The bit line reading circuit according to claim 1, wherein the sense amplifier comprises an N-type third transistor, an N-type fourth transistor, a P-type fifth transistor, and a P-type sixth transistor, and wherein:

a first electrode of the N-type third transistor is connected to the bit line, a second electrode of the N-type third transistor is connected to a first reference voltage source, and a gate of the N-type third transistor is connected to the reference line;

a first electrode of the N-type fourth transistor is connected to the reference line, a second electrode of the N-type fourth transistor is connected to the first reference voltage source, and a gate of the N-type fourth transistor is connected to the bit line;

a first electrode of the P-type fifth transistor is connected to the bit line, a second electrode of the P-type fifth transistor is connected to a second reference voltage source, and a gate of the P-type fifth transistor is connected to the reference line; and a first electrode of the P-type sixth transistor is connected to the reference line, a second electrode of the P-type sixth transistor is connected to the second reference voltage source, and a gate of the P-type sixth transistor is connected to the bit line.

8. The bit line reading circuit according to claim 1, wherein the precharge circuit comprises a seventh transistor and an eighth transistor, and wherein:

a first electrode of the seventh transistor is connected to the bit line, a second electrode of the seventh transistor is connected to a precharge voltage source, and a gate of the seventh transistor is connected to a precharge control line; and a first electrode of the eighth transistor is connected to the precharge voltage source, a second electrode of the eighth transistor is connected to the reference line, and a gate of the eighth transistor is connected to the precharge control line.

9. The bit line reading circuit according to claim 8, wherein the precharge circuit further comprises a ninth transistor, wherein a first electrode of the ninth transistor is connected to the bit line, a second electrode of the ninth transistor is connected to the reference line, and a gate of the ninth transistor is connected to the precharge control line.

10. The bit line reading circuit according to claim 1, further comprising a selection circuit, wherein the selection circuit is separately connected to the bit line and the reference line, and is configured to read data on the bit line and the reference line, or write data into the bit line and the reference line.

11. The bit line reading circuit according to claim 10, wherein the selection circuit comprises a tenth transistor and an eleventh transistor, and wherein:

a first electrode of the tenth transistor is configured to write data or read data, a second electrode of the tenth transistor is connected to the bit line, and a gate of the tenth transistor is connected to a first selection control line; and a first electrode of the eleventh transistor is configured to write data or read data, a second electrode of the eleventh transistor is connected to the reference line, and a gate of the eleventh transistor is connected to a second selection control line.

12. A memory, comprising a bit line reading circuit and a ferroelectric memory cell, wherein the ferroelectric memory cell comprises a plurality of ferroelectric capacitors connected in parallel and a transistor connected to the plurality of ferroelectric capacitors, a gate of the transistor is connected to a word line, a first electrode of the transistor is connected to a bit line of the bit line reading circuit, and a second electrode of the transistor is connected to the plurality of ferroelectric capacitors connected in parallel, and wherein the bit line reading circuit further comprises:

a reference line;

a sense amplifier, wherein the sense amplifier is separately connected to the bit line and the reference line, and is configured to perform differential amplification on voltages of the bit line and the reference line for output;

a precharge circuit, wherein the precharge circuit is separately connected to the bit line and the reference line, and is configured to precharge the bit line and the reference line;

a first switch, wherein the first switch is connected to the bit line between the sense amplifier and the precharge circuit; and a second switch, wherein the second switch is connected to the reference line between the sense amplifier and the precharge circuit.

13. The memory according to claim 12, wherein the bit line reading circuit further comprises a controller, and the controller is configured to turn off the first switch and the second switch when the sense amplifier performs differential amplification on the voltages of the bit line and the reference line for output, and turn off the first switch and the second switch when data is written into the bit line and the reference line.

14. The memory according to claim 13, wherein the controller is further configured to control the sense amplifier and the precharge circuit, so that the sense amplifier performs differential amplification on the voltages of the bit line and the reference line for output, and the precharge circuit precharges the bit line and the reference line.

15. The memory according to claim 12, wherein the bit line reading circuit further comprises at least one of:

a first transistor in the first switch, wherein a gate of the first transistor is connected to a first isolation control line, and a first electrode and a second electrode of the first transistor are connected to the bit line between the sense amplifier and the precharge circuit; or a second transistor in the second switch, wherein a gate of the second transistor is connected to a second isolation control line, and a first electrode and a second electrode of the second transistor are connected to the reference line between the sense amplifier and the precharge circuit.

16. The memory according to claim 15, wherein both the first transistor and the second transistor are N-type transistors or P-type transistors.

17. The memory according to claim 16, wherein the first isolation control line and the second isolation control line are a same control line.

18. The memory according to claim 12, wherein the sense amplifier comprises an N-type third transistor, an N-type fourth transistor, a P-type fifth transistor, and a P-type sixth transistor, and wherein:

a first electrode of the N-type third transistor is connected to the bit line, a second electrode of the N-type third transistor is connected to a first reference voltage source, and a gate of the N-type third transistor is connected to the reference line;

a first electrode of the N-type fourth transistor is connected to the reference line, a second electrode of the N-type fourth transistor is connected to the first reference voltage source, and a gate of the N-type fourth transistor is connected to the bit line;

a first electrode of the P-type fifth transistor is connected to the bit line, a second electrode of the P-type fifth transistor is connected to a second reference voltage source, and a gate of the P-type fifth transistor is connected to the reference line; and a first electrode of the P-type sixth transistor is connected to the reference line, a second electrode of the P-type sixth transistor is connected to the second reference voltage source, and a gate of the P-type sixth transistor is connected to the bit line.

19. The memory according to claim 12, wherein the precharge circuit comprises a seventh transistor and an eighth transistor, and wherein:

a first electrode of the seventh transistor is connected to the bit line, a second electrode of the seventh transistor is connected to a precharge voltage source, and a gate of the seventh transistor is connected to a precharge control line; and a first electrode of the eighth transistor is connected to the precharge voltage source, a second electrode of the eighth transistor is connected to the reference line, and a gate of the eighth transistor is connected to the precharge control line.

20. A reading method applied to a bit line reading circuit, wherein the bit line reading circuit is configured to read a level from a ferroelectric memory cell and comprises:

a bit line, wherein the bit line is connected to the ferroelectric memory cell;

a reference line;

a sense amplifier, wherein the sense amplifier is separately connected to the bit line and the reference line, and is configured to perform differential amplification on voltages of the bit line and the reference line for output;

a precharge circuit, wherein the precharge circuit is separately connected to the bit line and the reference line, and is configured to precharge the bit line and the reference line;

a first switch, wherein the first switch is connected to the bit line between the sense amplifier and the precharge circuit; and a second switch, wherein the second switch is connected to the reference line between the sense amplifier and the precharge circuit, and wherein the reading method comprises:

in a first phase, turning on the first switch and the second switch, and precharging, by the precharge circuit, the bit line and the reference line;

in a second phase, turning on the first switch and the second switch, and disconnecting the precharge circuit;

in a third phase, turning on the first switch and the second switch, and performing differential amplification, by the sense amplifier, on voltages of the bit line and the reference line;

in a fourth phase, turning off the first switch and the second switch, precharging, by the precharge circuit, the bit line and the reference line, and outputting, by the sense amplifier, the voltages of the bit line and the reference line, or writing data into the bit line and the reference line; and in a fifth phase, turning on the first switch and the second switch, and disconnecting the precharge circuit for a preset time and then connecting the precharge circuit.

* * * * *